United States Patent
Sun et al.

(10) Patent No.: US 11,882,733 B2
(45) Date of Patent: Jan. 23, 2024

(54) ORGANIC SEMICONDUCTOR SUBSTRATE

(71) Applicant: Au Optronics Corporation, Hsinchu (TW)

(72) Inventors: Shuo-Yang Sun, Hsinchu (TW); Shih-Hua Hsu, Hsinchu (TW); Ching-Wen Chen, Hsinchu (TW); Ying-Hui Lai, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 188 days.

(21) Appl. No.: 17/364,896

(22) Filed: Jul. 1, 2021

(65) Prior Publication Data
US 2022/0238621 A1 Jul. 28, 2022

(30) Foreign Application Priority Data
Jan. 25, 2021 (TW) .................................. 110102624

(51) Int. Cl.
| *H10K 59/125* | (2023.01) |
| *H10K 10/46* | (2023.01) |
| *H10K 59/131* | (2023.01) |

(52) U.S. Cl.
CPC ......... *H10K 59/125* (2023.02); *H10K 10/464* (2023.02); *H10K 59/131* (2023.02)

(58) Field of Classification Search
None
See application file for complete search history.

(56) References Cited

U.S. PATENT DOCUMENTS

| 7,399,989 | B2 | 7/2008 | Moriya et al. |
| 2002/0001048 | A1 | 1/2002 | Lee et al. |
| 2006/0098131 | A1 | 5/2006 | Lai |
| 2010/0072464 | A1 | 3/2010 | Kasahara |

(Continued)

FOREIGN PATENT DOCUMENTS

| CN | 106784313 | 5/2017 |
| TW | 584896 | 4/2004 |

(Continued)

OTHER PUBLICATIONS

English Translation of TW 201926754 A (Year: 2019).*

*Primary Examiner* — Khaja Ahmad
(74) *Attorney, Agent, or Firm* — JCIPRNET

(57) ABSTRACT

An organic semiconductor substrate includes a base, a first conductive pattern, a second conductive pattern, a first metal oxide pattern, a second metal oxide pattern, an organic flat pattern layer, a source, a drain, an organic semiconductor pattern, an organic gate insulating layer, and a gate. The first conductive pattern and the second conductive pattern are disposed on the base and separated from each other. The first metal oxide pattern and the second metal oxide pattern respectively cover and are electrically connected to the first conductive pattern and the second conductive pattern, respectively. A first portion of the organic flat pattern layer is disposed between the first metal oxide pattern and the second metal oxide pattern. A surface of the first metal oxide pattern has a first distance from the base. A surface of the first portion of the organic flat pattern layer has a second distance from the base. The second distance is less than or equal to the first distance.

9 Claims, 20 Drawing Sheets

10A

(56) References Cited

U.S. PATENT DOCUMENTS

2010/0276679 A1* 11/2010 Choi .................... H10K 10/464
                                                                                         257/40
2015/0137092 A1    5/2015  Hsu et al.
2017/0237028 A1* 8/2017 Xu ......................... H10K 10/84
                                                                                         257/40

FOREIGN PATENT DOCUMENTS

| TW | I288854 | 10/2007 |
| TW | I647870 | 1/2019 |
| TW | 201926754 | 7/2019 |

\* cited by examiner

ORGANIC SEMICONDUCTOR SUBSTRATE

CROSS-REFERENCE TO RELATED APPLICATION

This application claims the priority benefit of Taiwan application serial no. 110102624, filed on Jan. 25, 2021. The entirety of the above-mentioned patent application is hereby incorporated by reference herein and made a part of this specification.

BACKGROUND

Technology Field

The disclosure relates to a semiconductor substrate, and particularly relates to an organic semiconductor substrate.

Description of Related Art

Organic thin-film transistors (OTFT) have the advantages and characteristics of lightness, flexibility, and low process temperature, so they have been widely applied to display devices such as liquid crystal displays, organic light emitting displays, and electrophoretic displays. Taking the improvement of the electrical properties of an organic thin film transistor into account, an organic flat layer is manufactured first, then an organic semiconductor pattern is formed on the organic flat layer, and the organic semiconductor pattern is electrically connected to the source and drain disposed on the organic flat layer. Generally speaking, the source and the drain respectively are electrically connected to multiple conductive patterns under the organic flat layer through multiple contact windows of the organic flat layer. The organic flat layer requires a considerable thickness to form a contact window therein. However, the material of the organic flat layer is expensive, so the manufacturing cost of the organic thin film transistor gets higher as the thickness of the organic flat layer gets thicker.

SUMMARY

The disclosure provides an organic semiconductor substrate with low manufacturing cost.

According to an embodiment of the disclosure, an organic semiconductor substrate includes a base, a first conductive pattern, a second conductive pattern, a first metal oxide pattern, a second metal oxide pattern, an organic flat pattern layer, a source, a drain, an organic semiconductor pattern, an organic gate insulating layer, and a gate. The first conductive pattern and the second conductive pattern are disposed on the base and separated from each other. The first metal oxide pattern and the second metal oxide pattern respectively cover the first conductive pattern and the second conductive pattern and respectively electrically connected to the first conductive pattern and the second conductive pattern. The organic flat pattern layer includes a first portion. The first portion of the organic flat pattern layer is disposed between the first metal oxide pattern and the second metal oxide pattern. The first metal oxide pattern includes a surface facing away from the base. The surface of the first metal oxide pattern includes a first distance from the base. The first portion of the organic flat pattern layer includes a surface facing away from the base. The surface of the first portion of the organic flat pattern layer includes a second distance from the base, and the second distance is less than or equal to the first distance.

BRIEF DESCRIPTION OF THE DRAWINGS

FIG. 2A to FIG. 2K are schematic cross-sectional views illustrating the manufacturing process of the organic semiconductor substrate 10 according to an embodiment of the disclosure.

DESCRIPTION OF THE EMBODIMENTS

Figure 1A:
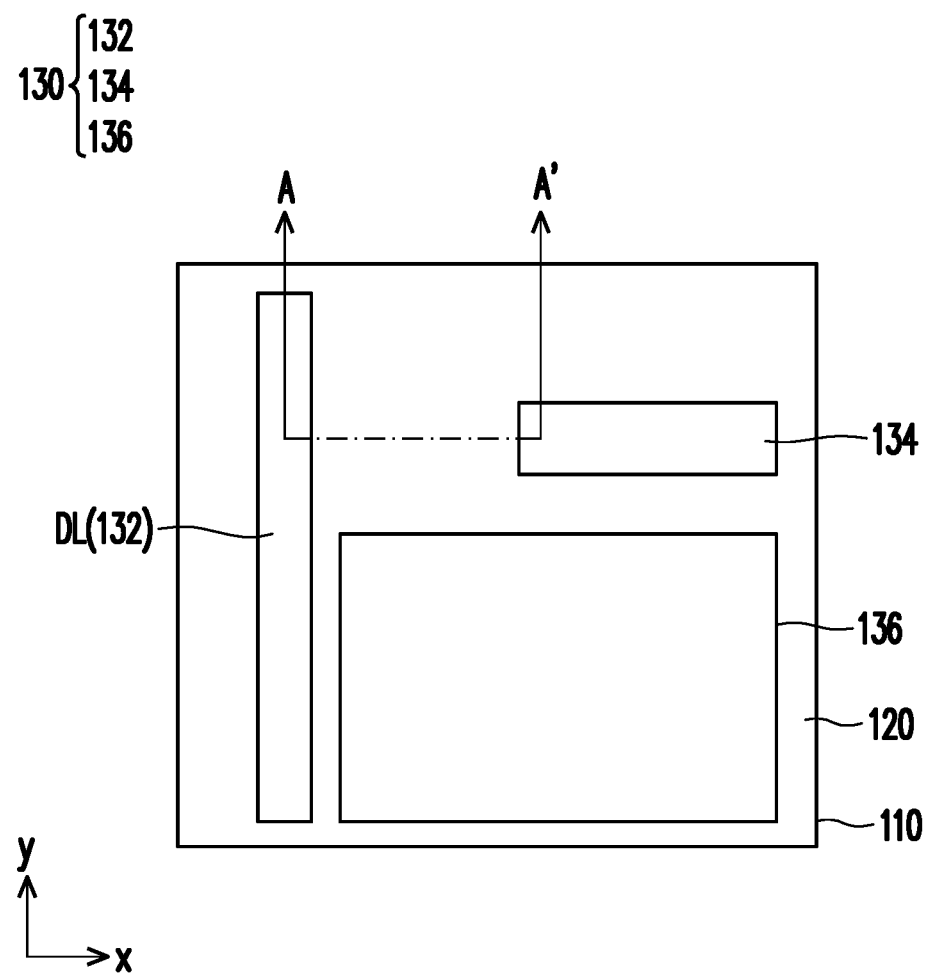
FIG. 1A to FIG. 1K are schematic top views illustrating a manufacturing process of an organic semiconductor substrate 10 according to an embodiment of the disclosure.

Reference will now be made in detail to the exemplary embodiments of the disclosure, examples of which are illustrated in the accompanying drawings. Whenever possible, the same reference numerals are used to represent the same or similar parts in the accompanying drawings and description.

It should be understood that when a device such as a layer, film, region, or substrate is referred to as being "on" or "connected to" another device, it may be directly on or connected to another device, or intervening devices may also be present. In contrast, when a device is referred to as being "directly on" or "directly connected to" another device, there are no intervening devices present. As used herein, "connected" can refer to physical and/or electrical connection. Furthermore, "electrically connected" or "coupled" may mean that there are other elements between two elements.

The term "about", "approximately", or "substantially" used herein includes the value and an average value within an acceptable deviation range of specific values determined by a person of ordinary skill in the art, taking into account discussed measurements and a specific number of measurement-related errors (i.e., limitations of a measuring system). For example, the term "about" may mean being within one or more standard deviations of the value, or within, for example, ±30%, ±20%, ±10%, and ±5%. Moreover, the term "about", "approximately", or "substantially" used herein may mean selecting a more acceptable deviation range or standard deviations according to measurement properties, cutting properties or other properties, without applying a single standard deviation to all properties.

Unless otherwise defined, all the terms used herein (including technical and scientific terms) have the same meaning as is commonly understood by a person of ordinary skill in the art. It should further be understood that terms such as those defined in commonly used dictionaries shall be interpreted as having meanings consistent with their meanings in the related art and the context of the disclosure and shall not be interpreted as having an idealized or overly formal meaning, unless so defined explicitly herein.

FIG. 1A to FIG. 1K are schematic top views illustrating a manufacturing process of an organic semiconductor substrate 10 according to an embodiment of the disclosure.

FIG. 2A to FIG. 2K are schematic cross-sectional views illustrating the manufacturing process of the organic semiconductor substrate 10 according to an embodiment of the disclosure.

FIG. 2A to FIG. 2K respectively correspond to the sections along line A-A' of FIG. 1A to FIG. 1K.

Figure 3:
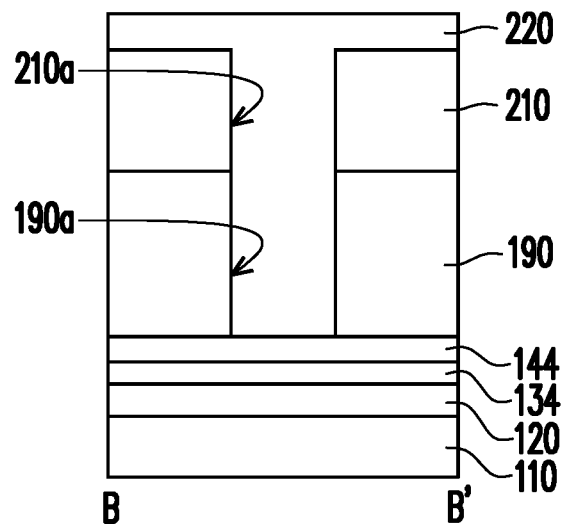
FIG. 3 is a schematic cross-sectional view of an organic semiconductor substrate 10 according to an embodiment of the disclosure.

FIG. 3 is a schematic cross-sectional view of an organic semiconductor substrate 10 according to an embodiment of the disclosure. FIG. 3 corresponds to the section along line B-B' of FIG. 1K.

Figure 4:
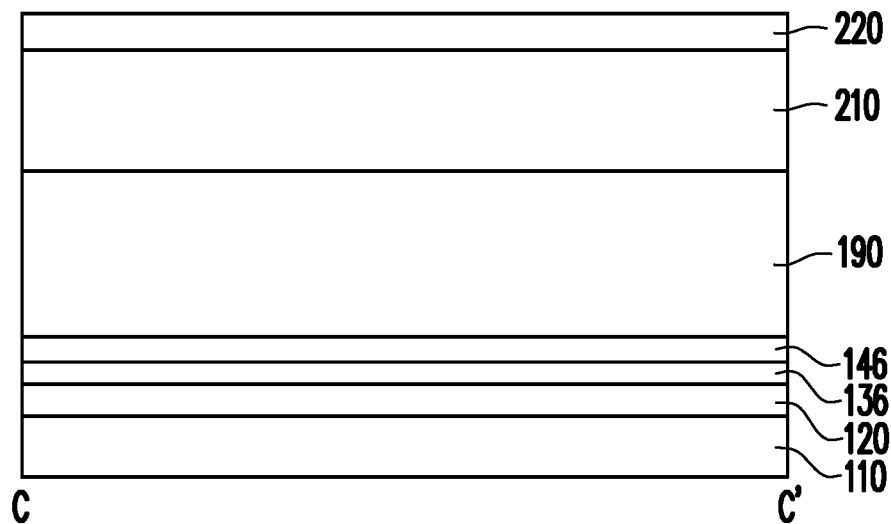
FIG. 4 is a schematic cross-sectional view of an organic semiconductor substrate 10 according to an embodiment of the disclosure.

FIG. 4 is a schematic cross-sectional view of an organic semiconductor substrate 10 according to an embodiment of the disclosure. FIG. 4 corresponds to the section along line C-C' of FIG. 1K.

With reference to FIG. 1A to FIG. 1K, FIG. 2A to FIG. 2K, FIG. 3 and FIG. 4, the manufacturing process and the structure of an organic semiconductor substrate 10 according to an embodiment of the disclosure are illustrated.

Figure 2A:
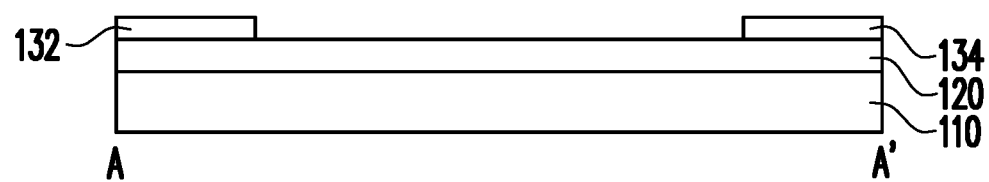

Referring to FIG. 1A and FIG. 2A, a base 110 is provided first. In the embodiment, for example, the base 110 is a flexible substrate, and for example, the material of the flexible substrate may include an organic polymer, such as polyimide (PI), polyethylene naphthalate (PEN), polyethylene terephthalate (PET), polycarbonates (PC), polyether sulfone (PES), polyarylate, other suitable materials, or a combination of at least two thereof. However, the disclosure is not limited thereto. In other embodiments, the base 110 may also be a hard substrate, and for example, the material of the hard substrate may include glass, quartz, or other suitable materials.

Referring to FIG. 1A and FIG. 2A, next, a buffer layer 120 may be selectively formed on the base 110. The buffer layer 120 may have a single-layer or multi-layer structure. For example, in the embodiment, the material of the buffer layer 120 may include silicon oxide, silicon nitride, silicon oxynitride, other suitable materials, or a combination of at least two thereof, but the disclosure is not limited thereto.

Referring to FIG. 1A and FIG. 2A, next a first conductive pattern layer 130 is formed on the base 110. In the embodiment, the first conductive pattern layer 130 may be disposed on the buffer layer 120. However, the disclosure is not limited thereto. In other embodiments, the first conductive pattern layer 130 may also be directly disposed on the base 110.

The first conductive pattern layer 130 may have a single-layer or multi-layer structure. In the embodiment, taking the conductivity into account, the material of the first conductive pattern layer 130 may include metal. For example, in the embodiment, the first conductive pattern layer 130 may include molybdenum/aluminum/molybdenum (Mo/Al/Mo) stacked sequentially, but the disclosure is not limited thereto.

The first conductive pattern layer 130 includes a first conductive pattern 132 and a second conductive pattern 134 disposed on the base 110 and separated from each other. In the embodiment, the first conductive pattern 132 may include a data line DL, and the second conductive pattern 134 can be used as a bridge element to bridge a drain 164 of the organic thin film transistor OTFT and a pixel electrode 220 in the subsequent manufacturing process, as shown in FIG. 1K.

Referring to FIG. 1A and FIG. 2A, in the embodiment, the first conductive pattern layer 130 further includes a third conductive pattern 136 disposed on the base 110 and separated from the first conductive pattern 132 and the second conductive pattern 134. In the embodiment, the third conductive pattern 136 can be used as an electrode of a storage capacitor.

Figure 1B:
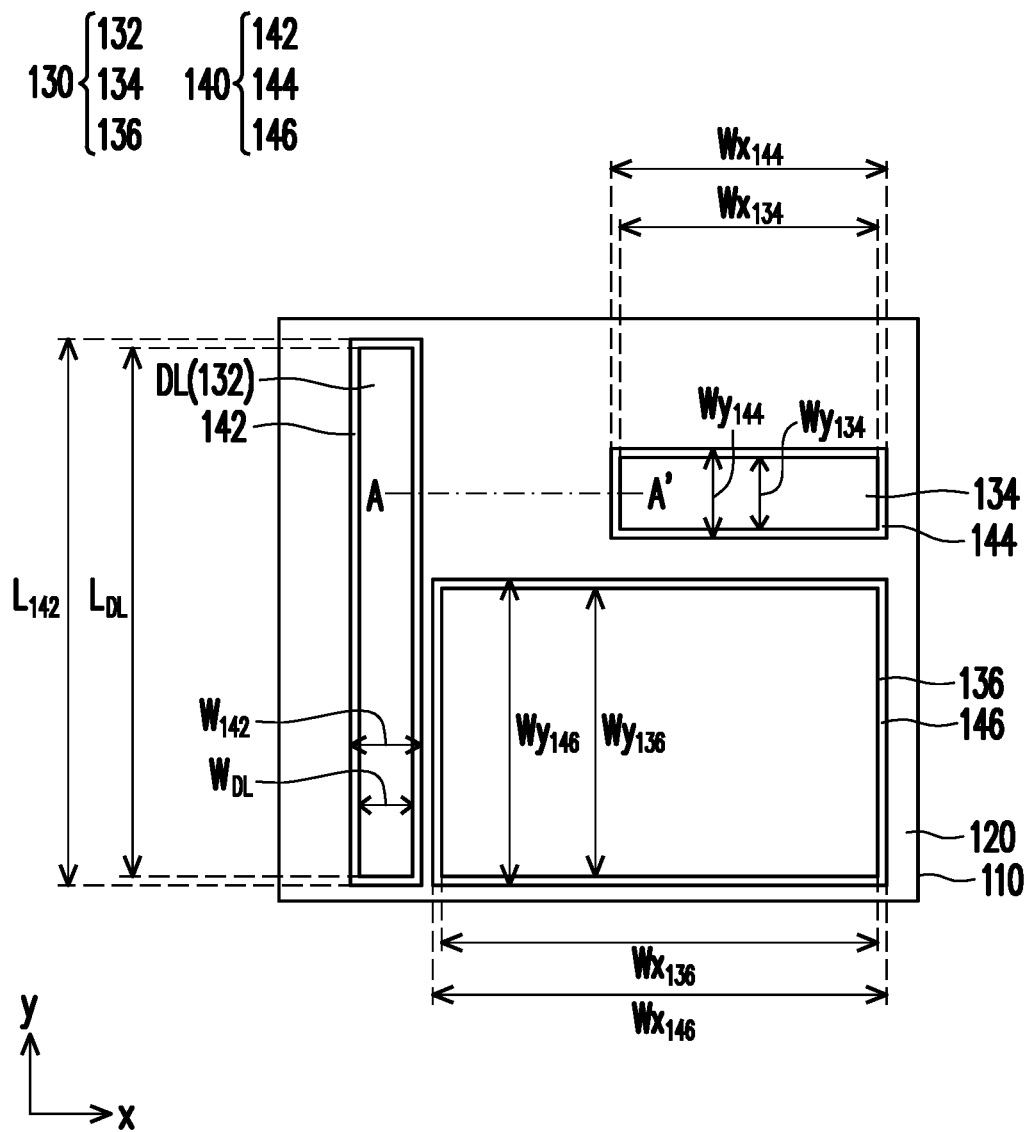
Figure 2B:
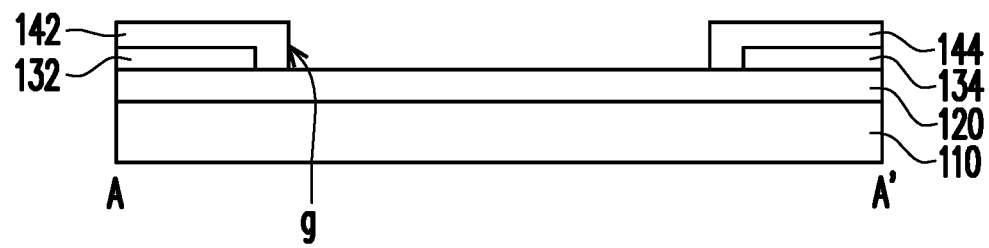

Referring to FIG. 1B and FIG. 2B, next, a metal oxide pattern layer 140 is formed on the base 110 to cover the first conductive pattern layer 130. In the subsequent manufacturing process, the metal oxide pattern layer 140 is used as an etching protection layer. For example, in the embodiment, the material of the metal oxide pattern layer 140 can be indium tin oxide, indium zinc oxide, aluminum tin oxide, aluminum zinc oxide, indium germanium zinc oxide, other suitable oxides, or a stacked layer of at least two thereto, but the disclosure is not limited thereto.

The metal oxide pattern layer 140 includes a first metal oxide pattern 142 and a second metal oxide pattern 144 separated from each other. The first metal oxide pattern 142 and the second metal oxide pattern 144 cover the first conductive pattern 132 and the second conductive pattern 134, respectively and are electrically connected to the first conductive pattern 132 and the second conductive pattern 134, respectively.

Referring to FIG. 1B, in the embodiment, the vertical projection of the first conductive pattern 132 on the base 110 is within the vertical projection of the first metal oxide pattern 142 on the base 110. The shape of the first conductive pattern 132 is substantially the same as the shape of the first metal oxide pattern 142, and the area of the first metal oxide pattern 142 is greater than the area of the first conductive pattern 132. In short, in the embodiment, the first metal oxide pattern 142 completely covers the first conductive pattern 132.

In the embodiment, the first conductive pattern 132 includes the data line DL. The data line DL has a line width $W_{DL}$ in the first direction x, the data line DL has a length $L_{DL}$ in the second direction y, the first metal oxide pattern 142 has a width $W_{142}$ in the first direction x, the first metal oxide pattern 142 has a length $L_{142}$ in the second direction y, the width $W_{142}$ of the first metal oxide pattern 142 is greater than the line width $W_{DL}$ of the data line DL, the length $L_{142}$ of the first metal oxide pattern 142 is also greater than the length $L_{DL}$ of the data line DL, and the first direction x and the second direction y are intersected. In short, in the embodiment, the first metal oxide pattern 142 completely covers the data line DL.

Referring to FIG. 1B, in the embodiment, the second conductive pattern 134 has a width $Wx_{134}$ in the first direction x, the second metal oxide pattern 144 has a width $Wx_{144}$ in the first direction x, and the width $Wx_{144}$ of the second metal oxide pattern 144 is greater than the width $Wx_{134}$ of the second conductive pattern 134. The second conductive pattern 134 has a width $Wy_{134}$ in the second direction y, the second metal oxide pattern 144 has a width $Wy_{144}$ in the second direction y, and the width $Wy_{144}$ of the second metal oxide pattern 144 is greater than the width $Wy_{134}$ of the second conductive pattern 134. In the embodiment, the vertical projection of the second conductive pattern 134 on the base 110 is within the vertical projection of the second metal oxide pattern 144 on the base 110. In the embodiment, the shape of the second conductive pattern 134 is substantially the same as the shape of the second metal oxide pattern 144, and the area of the second metal oxide pattern 144 is greater than the area of the second conductive pattern 134. In short, in the embodiment, the second metal oxide pattern 144 completely covers the second conductive pattern 134.

Referring to FIG. 1B, in the embodiment, the metal oxide pattern layer 140 further includes a third metal oxide pattern 146. The third metal oxide pattern 146 is separated from the first metal oxide pattern 142 and the second metal oxide pattern 144. The third metal oxide pattern 146 covers and is electrically connected to the third conductive pattern 136.

In the embodiment, the third conductive pattern 136 has a width $Wx_{136}$ in the first direction x, the third metal oxide pattern 146 has a width $Wx_{146}$ in the first direction x, and the width $Wx_{146}$ of the third metal oxide pattern 146 is greater than the width $Wx_{136}$ of the third conductive pattern 136. The third conductive pattern 136 has a width $Wy_{136}$ in the second direction y, the third metal oxide pattern 146 has a width $Wy_{146}$ in the second direction y, and the width $Wy_{146}$ of the third metal oxide pattern 146 is greater than the width $Wy_{136}$ of the third conductive pattern 136. In the embodiment, the vertical projection of the third conductive pattern 136 on the base 110 is within the vertical projection of the third metal oxide pattern 146 on the base 110. In the embodiment, the shape of the third conductive pattern 136 is substantially the same as the shape of the third metal oxide pattern 146, and the area of the third metal oxide pattern 146 is greater than the area of the third conductive pattern 136. In short, in the embodiment, the third metal oxide pattern 146 completely covers the third conductive pattern 136.

Figure 1C:
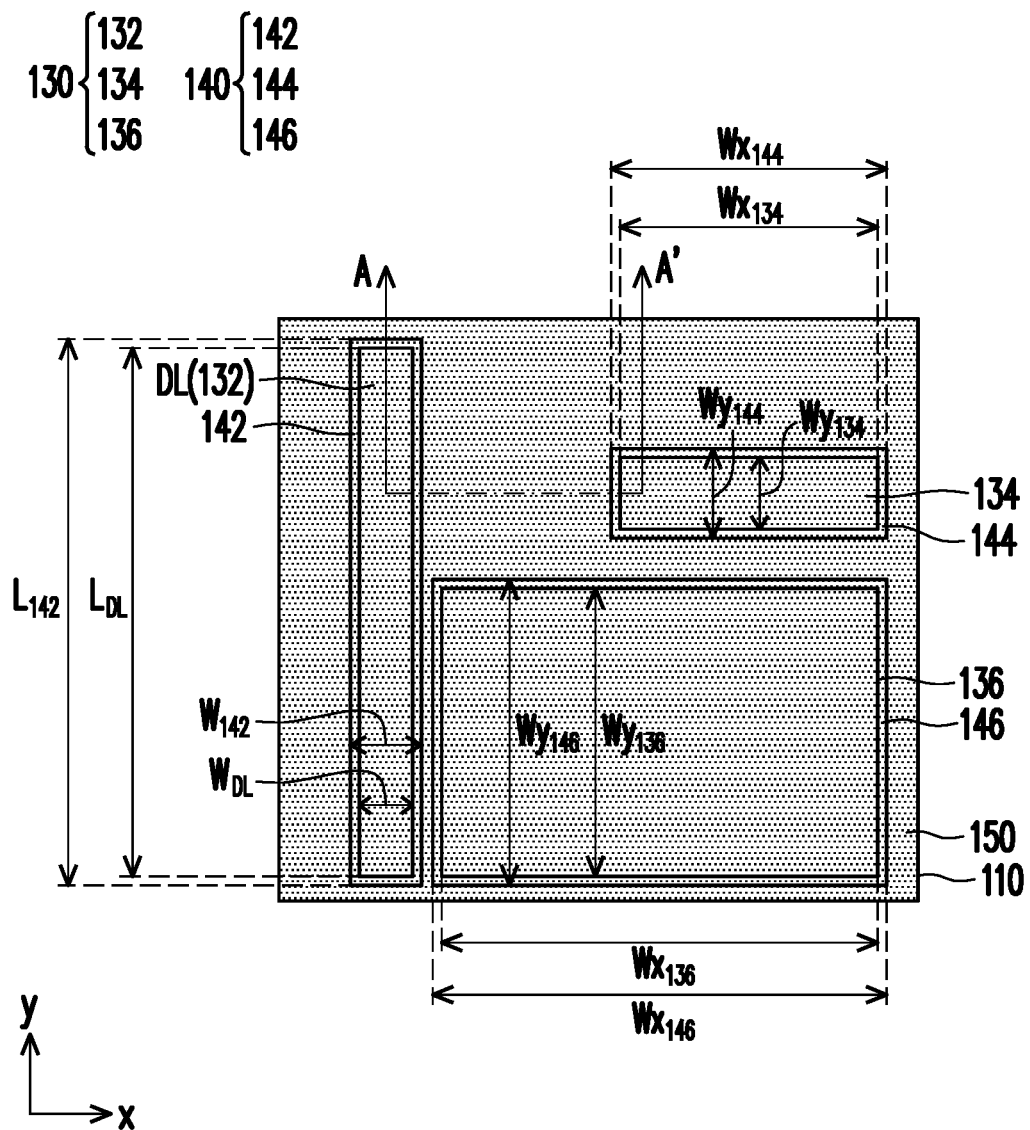
Figure 2C:
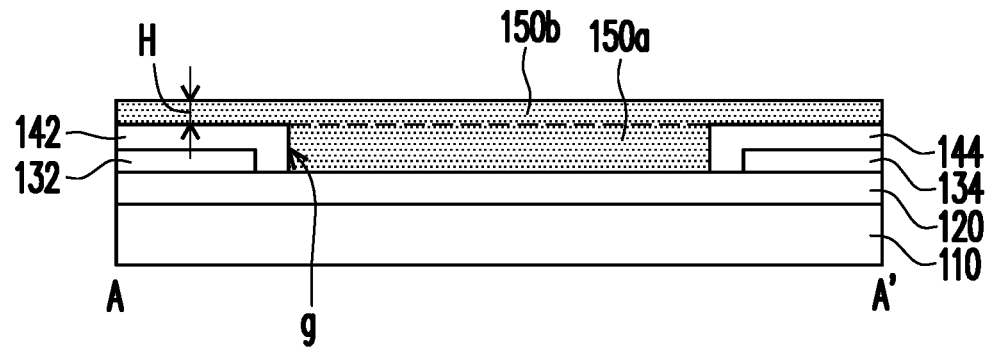

Referring to FIG. 1C and FIG. 2C, next, an organic flat layer 150 is formed on the base 110 to cover the metal oxide pattern layer 140 and part of the buffer layer 120. The organic flat layer 150 includes a first portion 150a and a second portion 150b. The first portion 150a of the organic flat layer 150 fills a gap g (as shown in FIG. 2C) among the first metal oxide pattern 142, the second metal oxide pattern 144, and the third metal oxide pattern 146. The second portion 150b of the organic flat layer 150 is disposed on the first portion 150a of the organic flat layer 150, the first metal oxide pattern 142, the second metal oxide pattern 144, and the third metal oxide pattern 146. For example, in the embodiment, the material of the organic flat layer 150 may include various polymers, such as but not limited to polyvinyl phenol, polyvinyl acetate, polyvinyl alcohol, polyacrylate, polymethacrylate, polymethylmethacrylate, polystyrene, polyvinylamine, polymaleimide, polyimine, polyimide, silicone polymer, phenol formaldehyde (Novolac) resin, benzene Oxazole polymers, polyoxadiazoles, maleic anhydride polymers, and copolymers thereof.

Referring to FIG. 1C, FIG. 1D, FIG. 2C, and FIG. 2D, next, the second portion 150b of the organic flat layer 150 is removed to form an organic flat pattern layer 152. For example, in the embodiment, an O2 plasma ashing process can be used to remove the second portion 150b of the organic flat layer 150 to form the organic flat pattern layer 152, but the disclosure is not limited thereto.

Figure 1D:
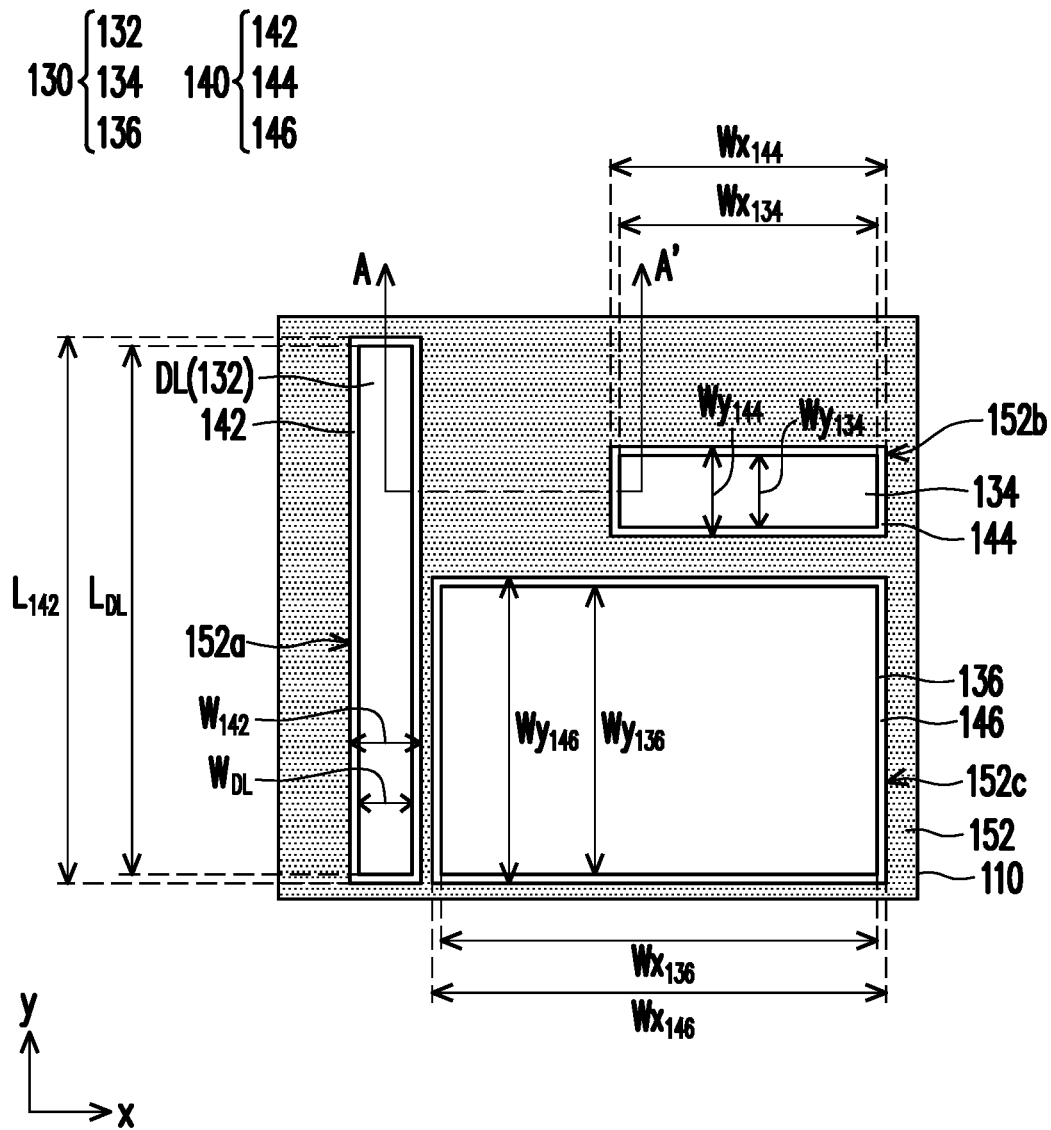
Figure 1K:
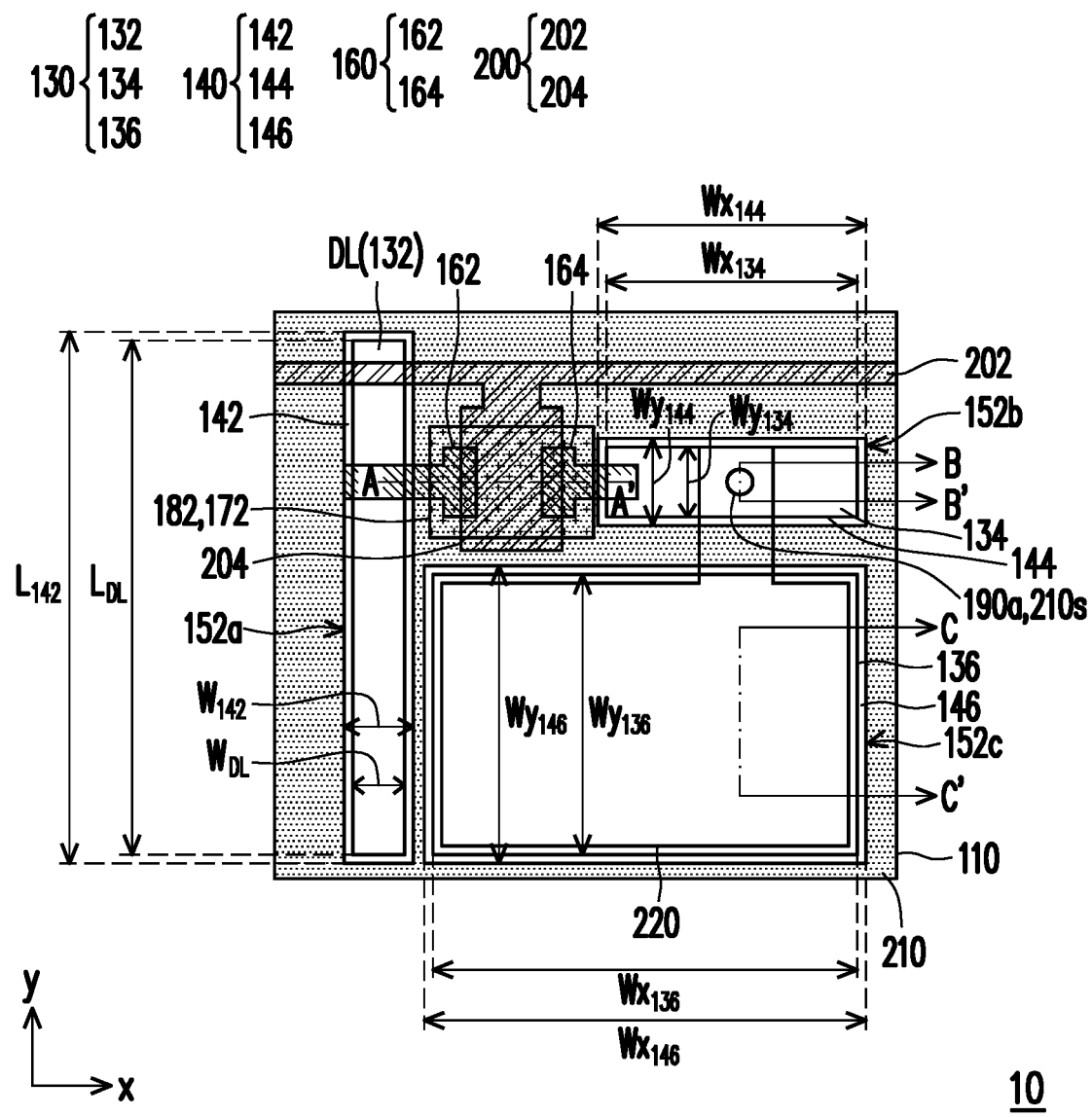
Figure 2D:
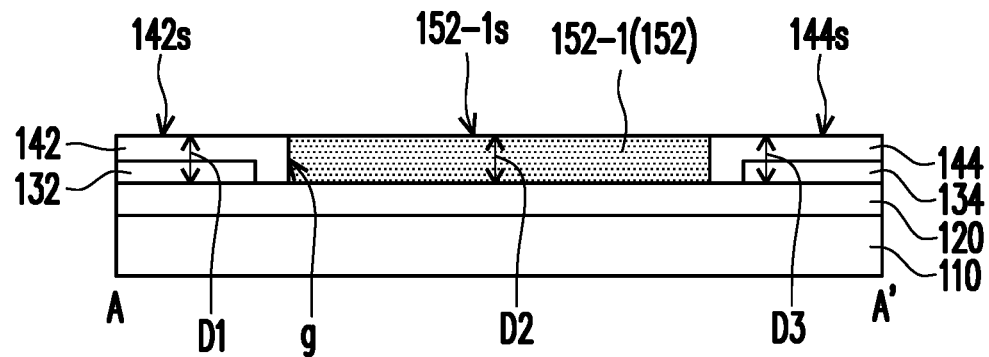

Referring to FIG. 1D and FIG. 2D, the organic flat pattern layer 152 fills the gap g among the first metal oxide pattern 142, the second metal oxide pattern 144, and the third metal oxide pattern 146. The organic flat pattern layer 152 has a first opening 152a, a second opening 152b, and a third opening 152c respectively exposing the first metal oxide pattern 142, the second metal oxide pattern 144, and the third metal oxide pattern 146. In the top view of the organic semiconductor substrate 10 (as shown in FIG. 1K), the first metal oxide pattern 142 fills up but does not exceed the first opening 152a of the organic flat pattern layer 152; the second metal oxide pattern 144 fills up but does not exceed the second opening 152b of the organic flat pattern layer 152; the third metal oxide pattern 146 fills up but does not exceed the third opening 152c of the organic flat pattern layer 152. In short, in the top view of the organic semiconductor substrate 10 (as shown in FIG. 1K), the metal oxide pattern layer 140 is complementary to the organic flat pattern layer 152.

Referring to FIG. 2D, the organic flat pattern layer 152 has a first portion 152-1 disposed between the first metal oxide pattern 142 and the second metal oxide pattern 144. The first metal oxide pattern 142 has a surface 142s facing away from the base 110, and the surface 142s of the first metal oxide pattern 142 has a first distance D1 from the base 110. The first portion 152-1 of the organic flat pattern layer 152 has a surface 152-1s facing away from the base 110, the surface 152-1s of the first portion 152-1 of the organic flat pattern layer 152 has a second distance D2 from the base 110, and the second distance D2 is less than or equal to the first distance D1. The second metal oxide pattern 144 has a surface 144s facing away from the base 110, the surface 144s of the second metal oxide pattern 144 has a third distance D3 from the base 110, and the second distance D2 is less than or equal to the third distance D3.

Figure 1E:
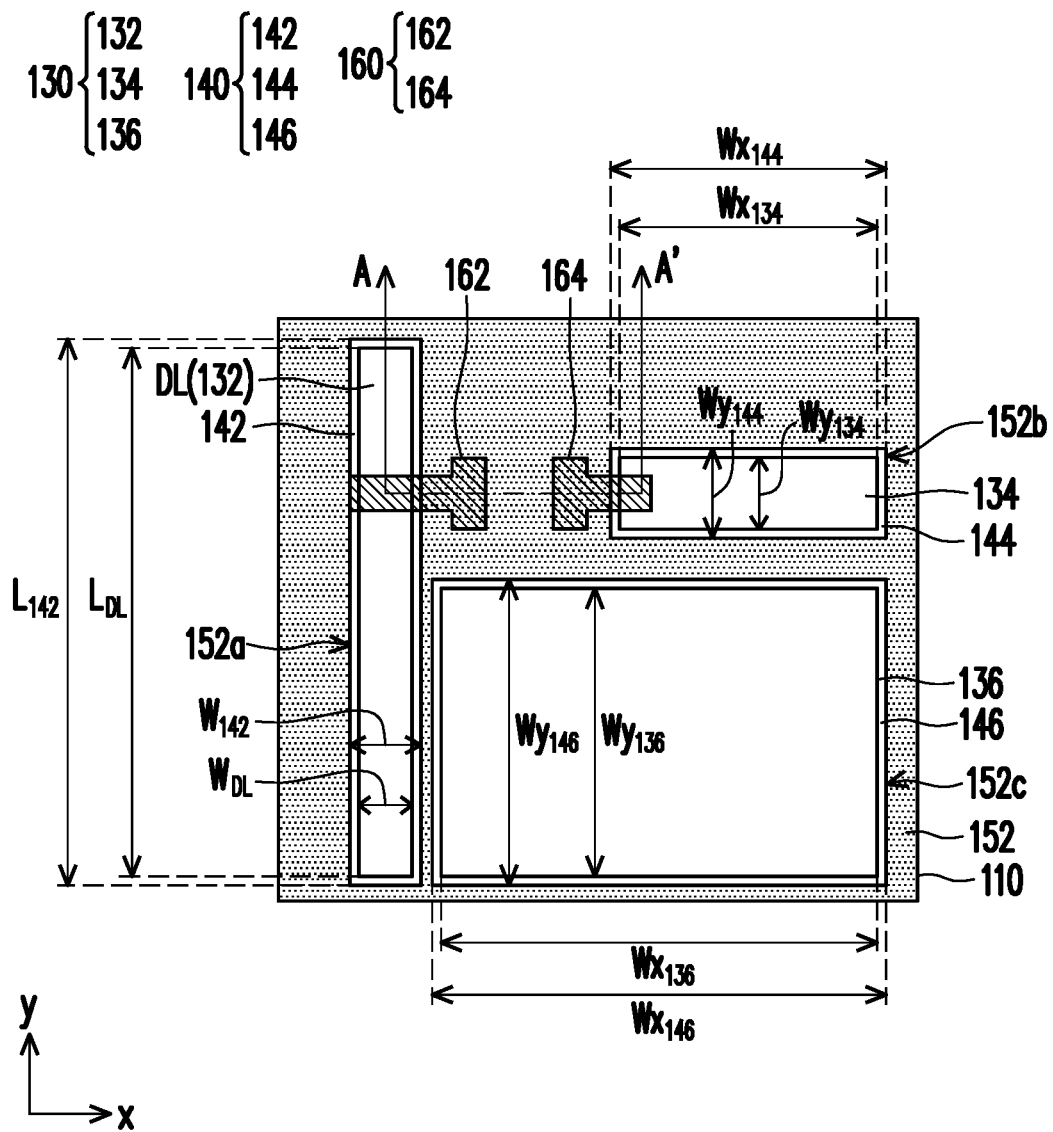
Figure 2E:
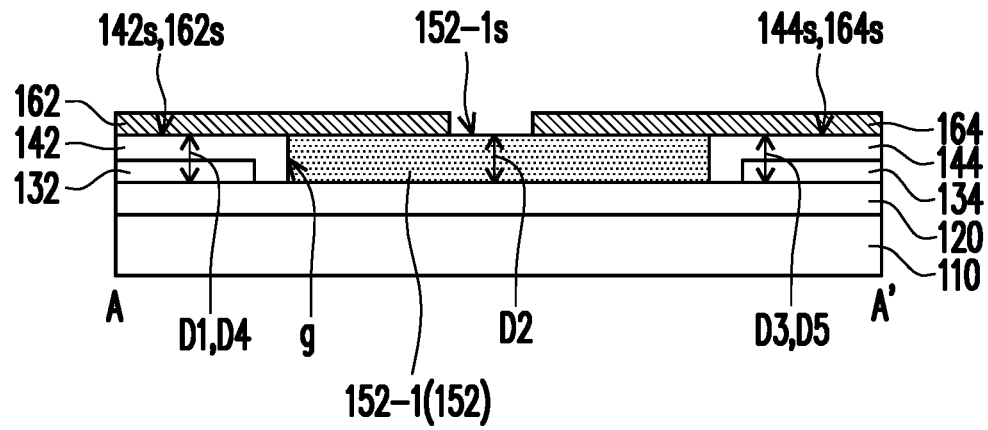

Referring to FIGS. 1E and 2E, next, a second conductive pattern layer 160 is formed on the metal oxide pattern layer 140 and the organic flat pattern layer 152. The second conductive pattern layer 160 may have a single-layer or multi-layer structure. For example, in the embodiment, the material of the second conductive pattern layer 160 may include metal. However, the disclosure is not limited thereto. In other embodiments, the material of the second conductive pattern layer 160 may also include other conductive materials, such as but not limited to alloys, nitrides of metal materials, oxides of metal materials, oxynitrides of metal materials, other suitable materials, or a stacked layer of the conductive materials thereof.

The second conductive pattern layer 160 includes a source 162 and the drain 164 separated from each other. The source 162 and the drain 164 are respectively disposed on the first metal oxide pattern 142 and the second metal oxide pattern 144 and are electrically connected to the first metal oxide pattern 142 and the second metal oxide pattern 144, respectively. In particular, at least part of the source 162 is directly disposed on the first metal oxide pattern 142 to be in electrical contact with the first metal oxide pattern 142, and the source 162 does not need to be electrically connected to the first metal oxide pattern 142 through any contact window of the organic flat pattern layer 152. At least part of the drain 164 is directly disposed on the second metal oxide pattern 144 and is in electrical contact with the second metal oxide pattern 144. The drain 164 does not need to be electrically connected to the second metal oxide pattern 144 through any contact window of the organic flat pattern layer 152.

Referring to FIG. 2E, in the embodiment, the first portion 152-1 of the organic flat pattern layer 152 has the surface 152-1s facing away from the base 110, the surface 152-1s of the first portion 152-1 of the organic flat pattern layer 152 has the second distance D2 from the base 110, the source 162 has a contact surface 162s in direct contact with the first metal oxide pattern 142, the contact surface 162s of the source 162 has a fourth distance D4 from the base 110, and the fourth distance D4 is greater than or equal to the second distance D2. The drain 164 has a contact surface 164s in direct contact with the second metal oxide pattern 144, the contact surface 164s of the drain 164 has a fifth distance D5 from the base 110, and the fifth distance D5 is greater than or equal to the second distance D2.

Note that in the process, the second portion 150b of the organic flat layer 150 is removed to expose the first metal oxide pattern 142 and the second metal oxide pattern 144 (as shown in FIG. 2C and FIG. 2D), and the source 162 and the drain 164 can be directly formed on the first metal oxide pattern 142 and the second metal oxide pattern 144 so that the source 162 and the drain 164 can be in electrical contact the first metal oxide pattern 142 and the second metal oxide pattern 144 (as shown in FIG. 2E). Therefore, a thickness H (as shown in FIG. 2C) of the second portion 150b of the organic flat layer 150 formed on the first metal oxide pattern 142 and the second metal oxide pattern 144 does not need to be very thick, and the amount of the materials of the organic flat layer 150 can be greatly reduced, which contributes to reducing the manufacturing costs. Moreover, in the embodiment, the 02 plasma ashing process is used to remove the second portion 150b of the organic flat layer 150 to form the organic flat pattern layer 152, so a photomask is not required in the process of forming the organic flat pattern layer 152, and the total number of photomasks required in the manufacturing process can be reduced, which also contributes to reducing the manufacturing costs.

Figure 1F:
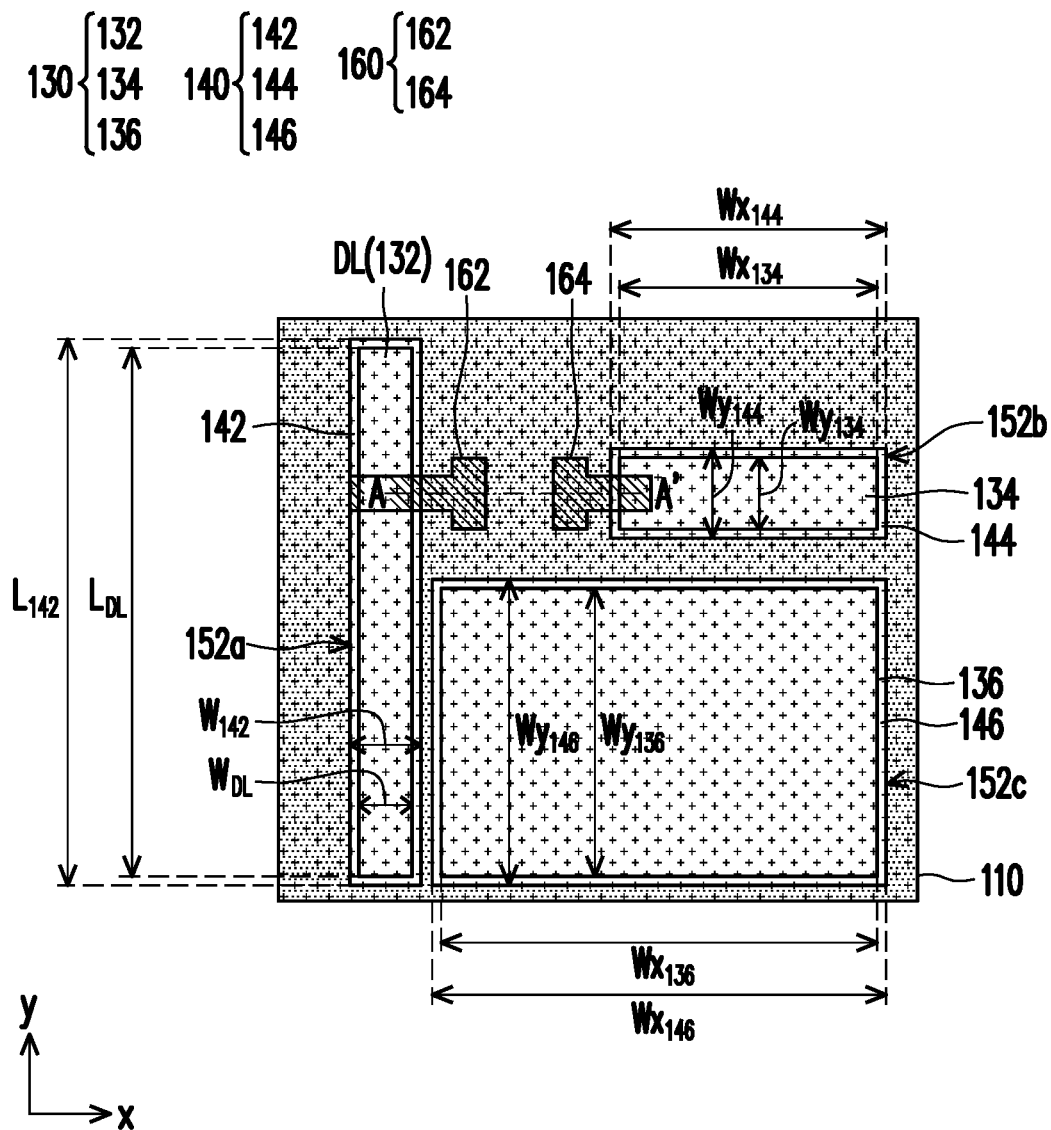
Figure 1G:
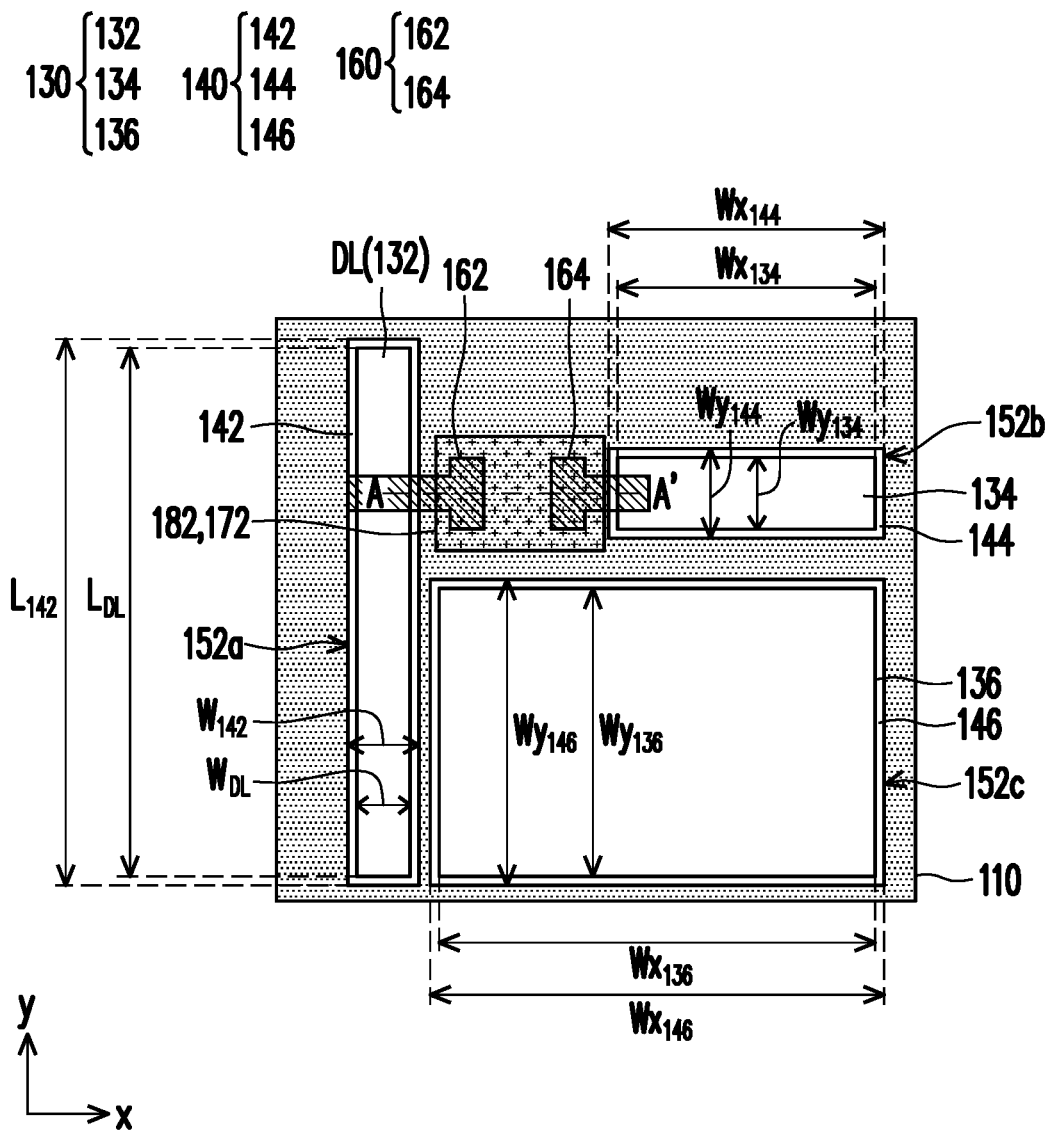
Figure 2F:
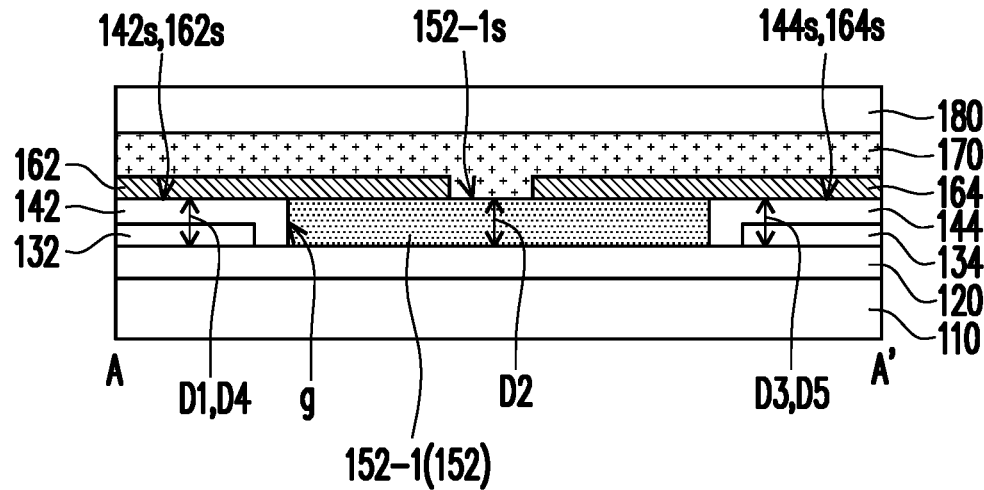

Referring to FIG. 1F and FIG. 2F, next, an organic semiconductor layer 170 and an organic protection layer 180 are sequentially formed on the second conductive pattern layer 160 and the organic flat pattern layer 152. Referring to FIG. 1F, FIG. 1G, FIG. 2F, and FIG. 2G, then, the organic protection layer 180 is patterned by a photolithography process to form an organic protection pattern 182. Next, the organic semiconductor layer 170 is etched using the organic protection pattern 182 as a mask to form an organic semiconductor pattern 172. In the embodiment, the organic protection pattern 182 may be selectively retained. However, the disclosure is not limited thereto, and in other embodiments, the organic protection pattern 182 may also be removed.

Figure 2G:
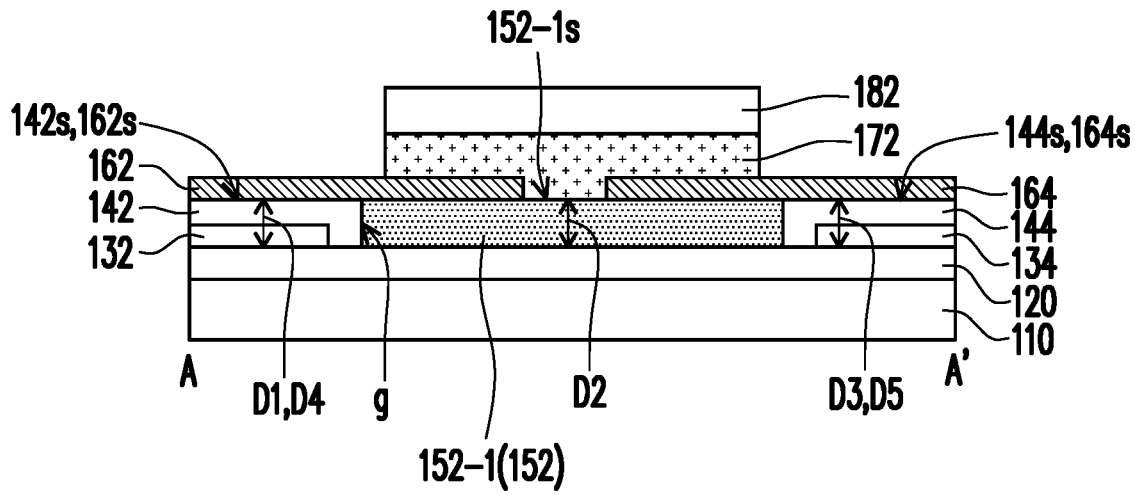

Referring to FIG. 1G and FIG. 2G, the organic semiconductor pattern 172 is disposed on the source 162, the drain 164, and the first portion 152-1 of the organic flat pattern layer 152. Two regions of the organic semiconductor pattern 172 are electrically connected to the source 162 and the drain 164, respectively.

In the embodiment, the material of the organic semiconductor pattern 172 may include various fused heterocycles, aromatic hydrocarbons (e.g., pentacene), polythiophenes, fused (hetero)aromatic compounds (e.g., perylene imine and naphthalimide small molecules or polymers), random copolymers of polycyclic aromatic hydrocarbons (e.g., benzochalcogen, benzochalcogen, and triarylamine monomer units), polyacetylene, polyterephthalate and its derivatives, polyphthalate and its derivatives, polypyrrole and its derivatives, polythiophenol and its derivatives, polyfuran and its derivatives, polyaniline and its derivatives, other suitable materials, or a combination thereof.

In some embodiments, the organic semiconductor pattern 172 includes at least one of the following compounds: 2,7-dibromo[1]benzothieno[3,2-b][1]benzothiophene, 2,7-Bis[(4,4,5,5-Tetramethyl-1,3,2-dioxaborolan-2-yl)]-9,9-di-n-octylpyridine and 2-(4-(diphenylamino)phenyl)-2-methyl-propionitrile.

The material of the organic protection pattern 182 may include electrically insulating materials, such as but not limited to fluoropolymer, polyisobutylene, poly(vinylphenol-co-methyl methacrylate), polyvinyl alcohol, polypropylene, polyvinyl chloride, polycyano pullulan, polyvinyl phenyl, polyvinyl cyclohexane, based on Benzocyclobutane polymer, polymethyl methacrylate, poly(styrene-co-butadiene), polycyclohexyl methacrylate, copolymer of methyl methacrylate and styrene, polymethoxystyrene (PMeOS), copolymer of methoxystyrene and styrene, polyacetoxystyrene (PAcOS), copolymer of acetoxystyrene and styrene, copolymer of styrene and vinyl toluene, polyvinylpyridine, polyvinyl fluoride, polyacrylonitrile, poly4-vinylpyridine, poly(2-ethyl-2-oxazoline), polytrimethylene Fluorochloroethylene, polyvinylpyrrolidone and polypentafluorostyrene.

Figure 1H:
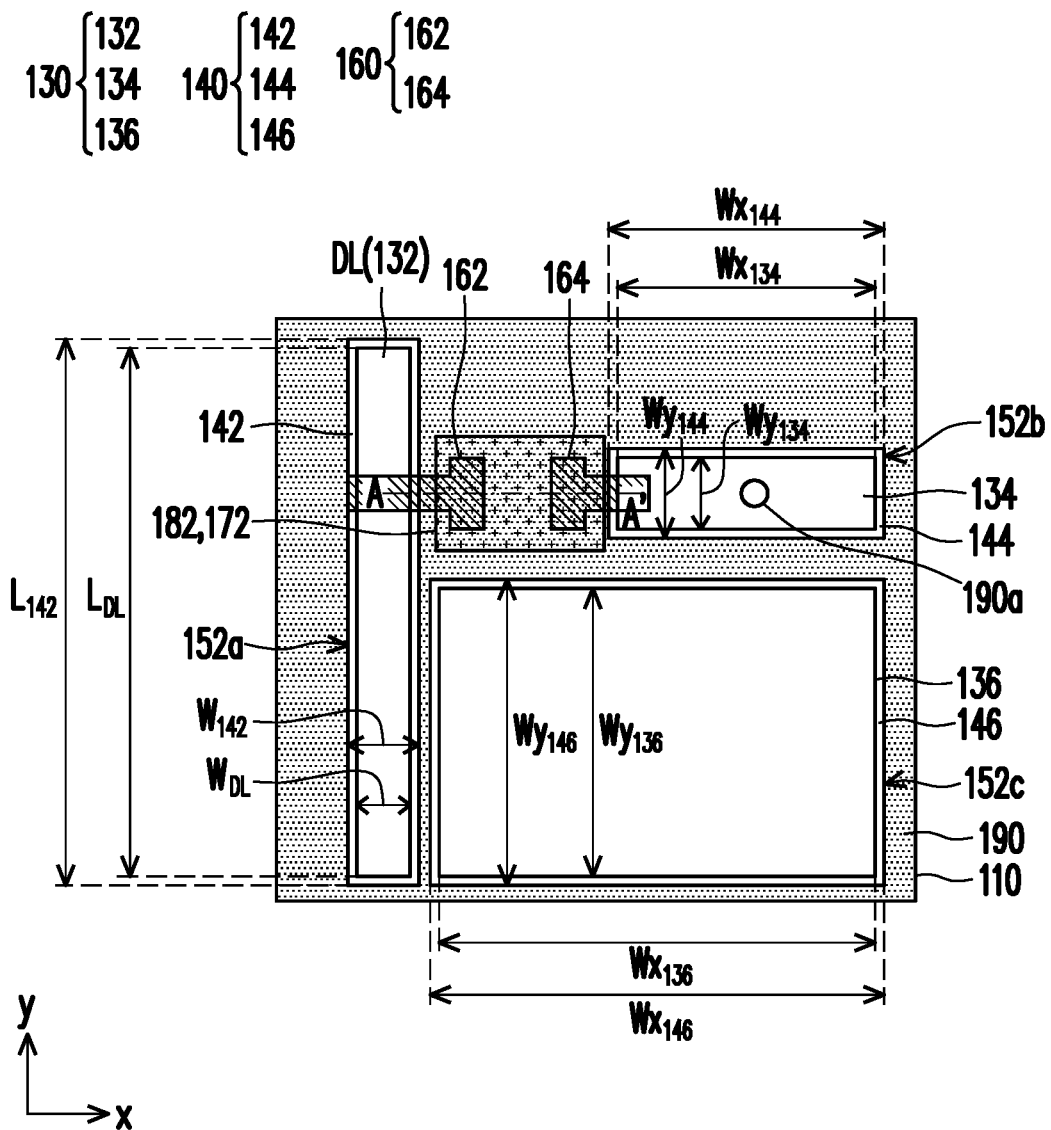
Figure 2H:
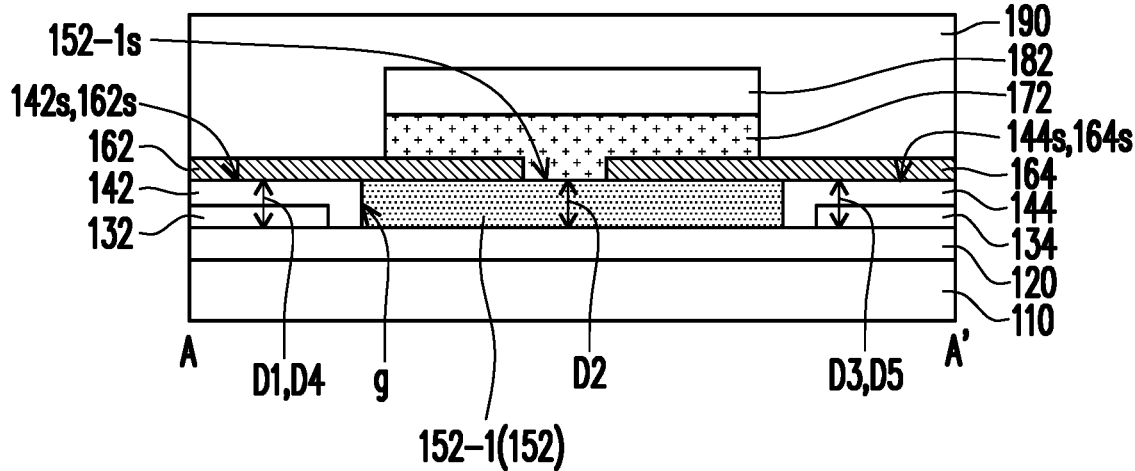
Figure 21:
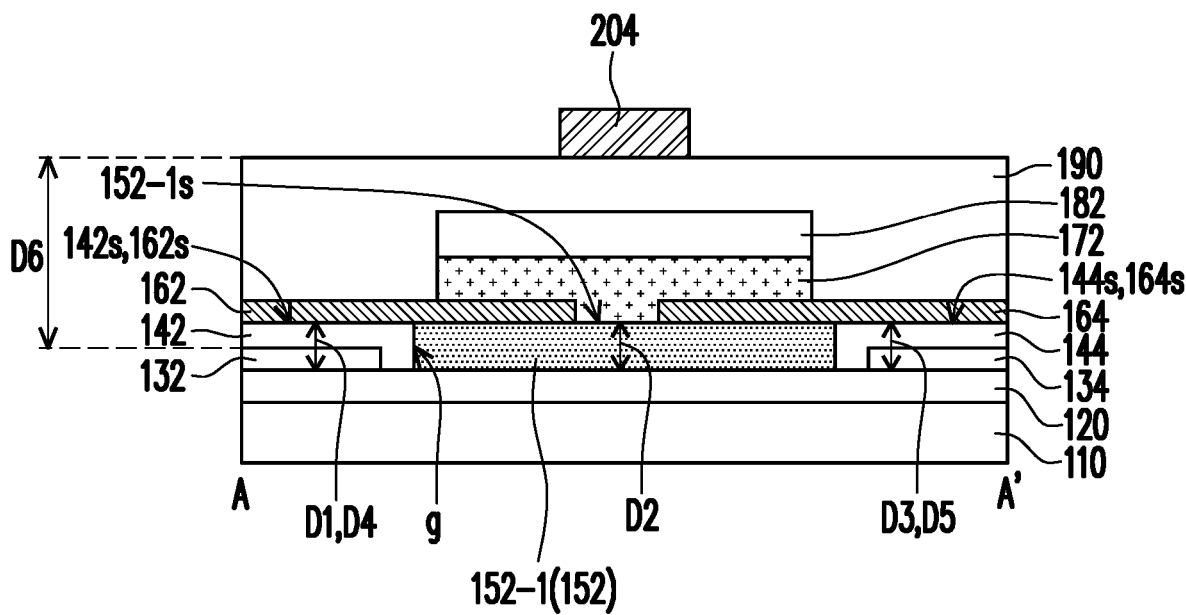

Referring to FIG. 1H and FIG. 2H, next, an organic gate insulating layer 190 is formed on the base 110 to cover the organic protection pattern 182, the organic semiconductor pattern 172, and the second conductive pattern layer 160. The organic gate insulating layer 190 is disposed on the organic semiconductor pattern 172, the organic protection pattern 182, and the second conductive pattern layer 160. The organic gate insulating layer 190 has a contact window 190a (shown in FIG. 1H) overlapping the second metal oxide pattern 144.

The organic gate insulating layer 190 may have a single-layer or multi-layer structure, and the material of the organic gate insulating layer 190 may include electrical insulating materials, such as various dielectric polymers. The dielectric polymers may be vinyl polymers obtained by polymerization of one or more acyclic vinyl monomers, polymers derived from one or more vinyl phenol monomers (e.g., poly-4-vinylphenol (PVP)), or a copolymer of vinyl phenol or a vinyl phenol derivative and at least one other vinyl monomer. Examples of the acyclic vinyl monomers include ethylene, propylene, butadiene, styrene, vinyl phenol, vinyl chloride, vinyl acetate, acrylic esters (e.g., methacrylate, methyl methacrylate, acrylic acid, methacrylic acid, acrylamide), and acrylonitrile and its derivatives. The vinyl monomers may be acrylic monomers, such as methyl methacrylate, methacrylate, acrylic acid, methacrylic acid, acrylamide or its derivatives.

Figure 1I:
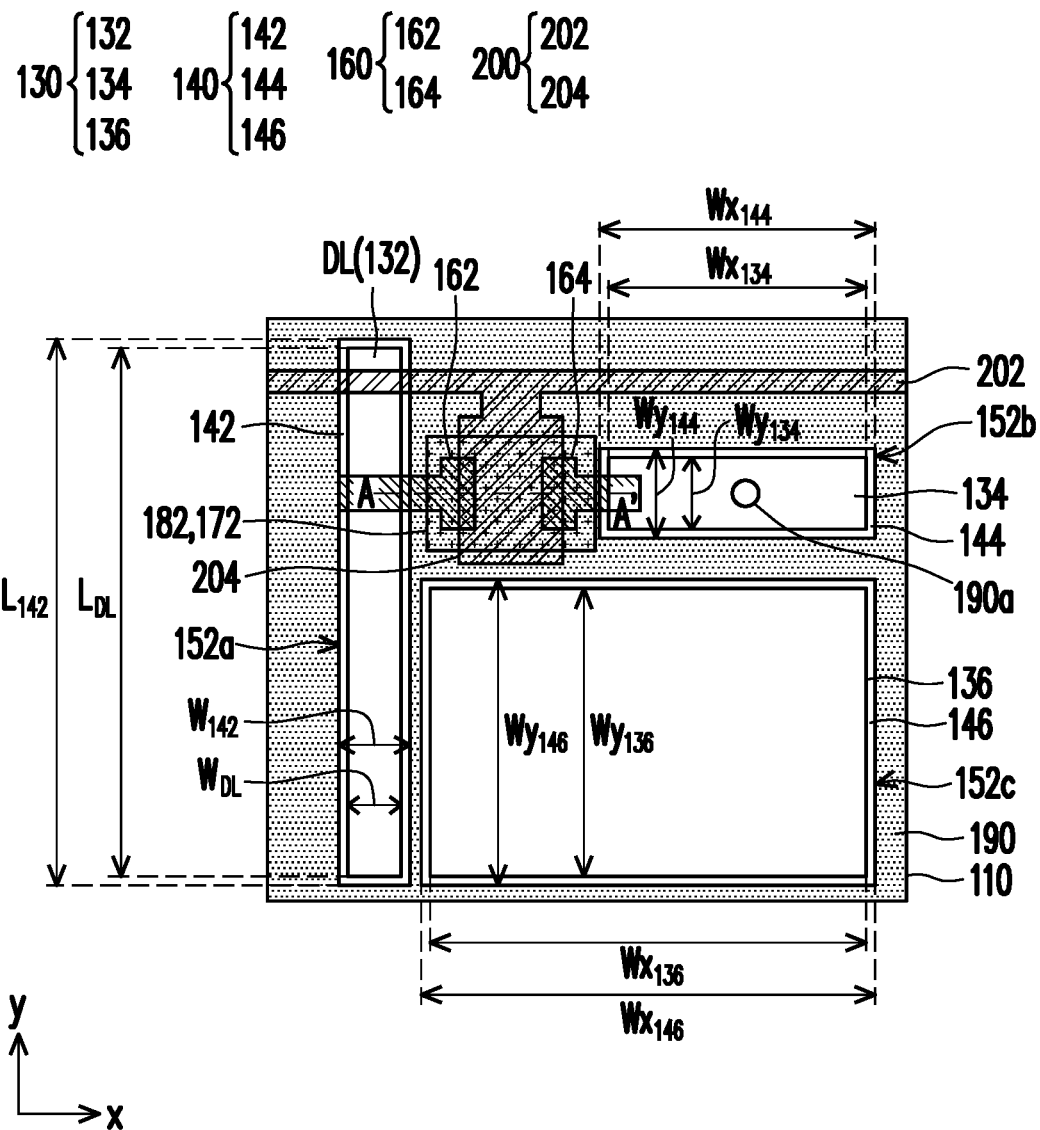

Referring to FIG. 1I and FIG. 2I, next, a third conductive pattern layer 200 is formed on the organic gate insulating layer 190. The third conductive pattern layer 200 includes a scan line 202 and a gate 204 connected to the scan line 202. The gate 204, the organic gate insulating layer 190, the organic semiconductor pattern 172, the source 162, and the drain 164 can form an organic thin film transistor OTFT. The third conductive pattern layer 200 may be a single layer or a multilayer structure. Taking the conductivity into account, the third conductive pattern layer 200 generally includes a metal material, but the disclosure is not limited thereto. In other embodiments, for example, the material of the third conductive pattern layer 200 includes alloys, nitrides of metal materials, oxides of metal materials, oxynitrides of metal materials, other suitable materials, or a stacked layer of metal materials and other conductive materials.

Note that, in the embodiment, at least part of the source 162 is directly disposed on the first metal oxide pattern 142 and is in electrical contact with the first metal oxide pattern 142, and the source 162 does not need to be electrically connected to the first metal oxide pattern 142 through any contact window of the organic flat pattern layer 152. At least part of the drain 164 is directly disposed on the second metal oxide pattern 144 and is in electrical contact with the second metal oxide pattern 144, and the drain 164 does not need to be electrically connected to the second metal oxide pattern 144 through any contact window of the organic flat pattern layer 152. That is, the organic flat pattern layer 152 is not disposed above the second conductive pattern layer 160 to which the source 162 and the drain 164 belong. Therefore, a distance D6 (as shown in FIG. 2I) between the gate 204 and the first conductive pattern layer 130 is short, so that the capacitance value between the gate 204 and the first conductive pattern layer 130 is large, which contributes to the applications in electronic products (e.g., flexible sensors, electronic paper, etc.) that require large capacitance.

Figure 1J:
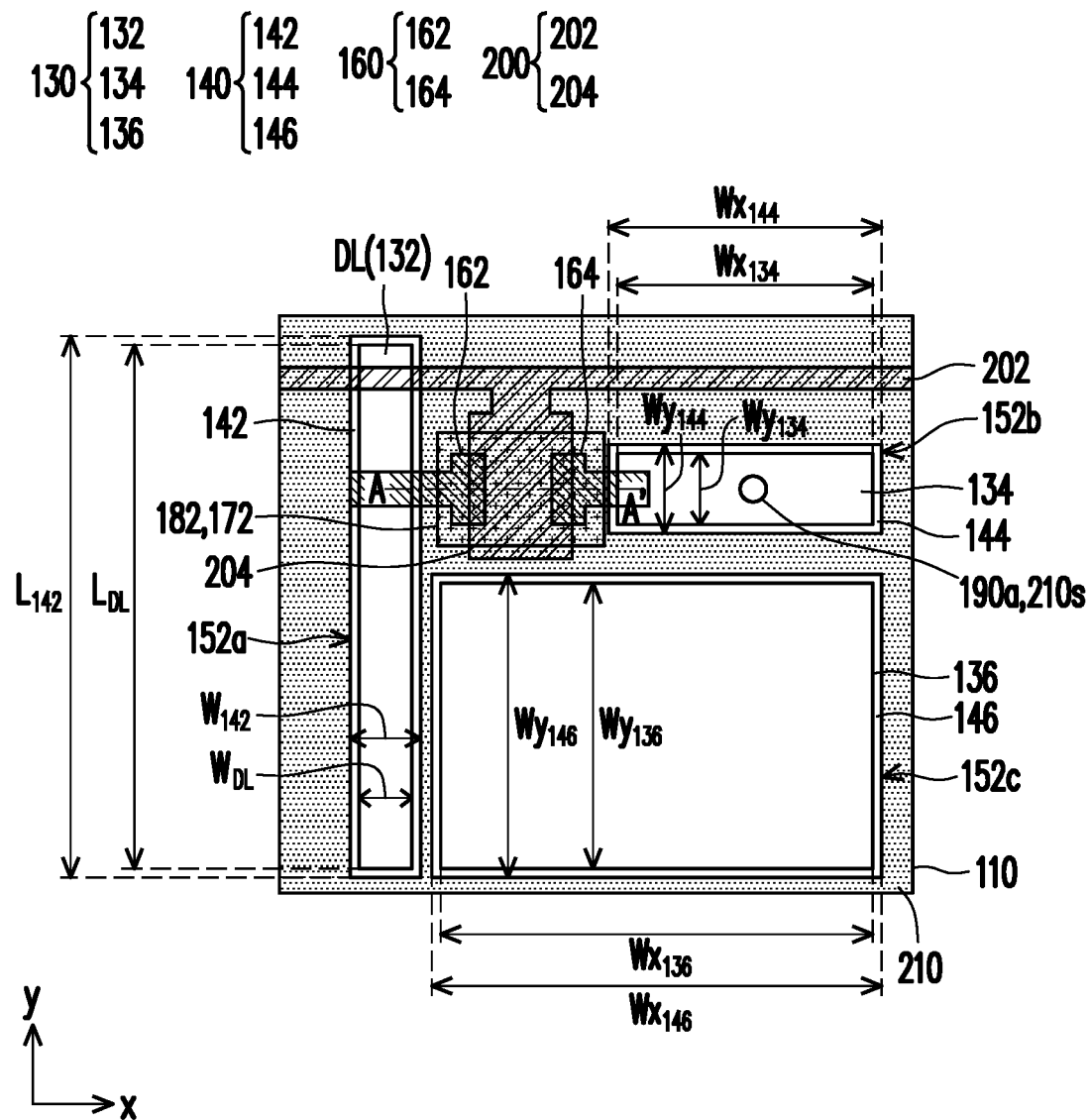
Figure 2J:
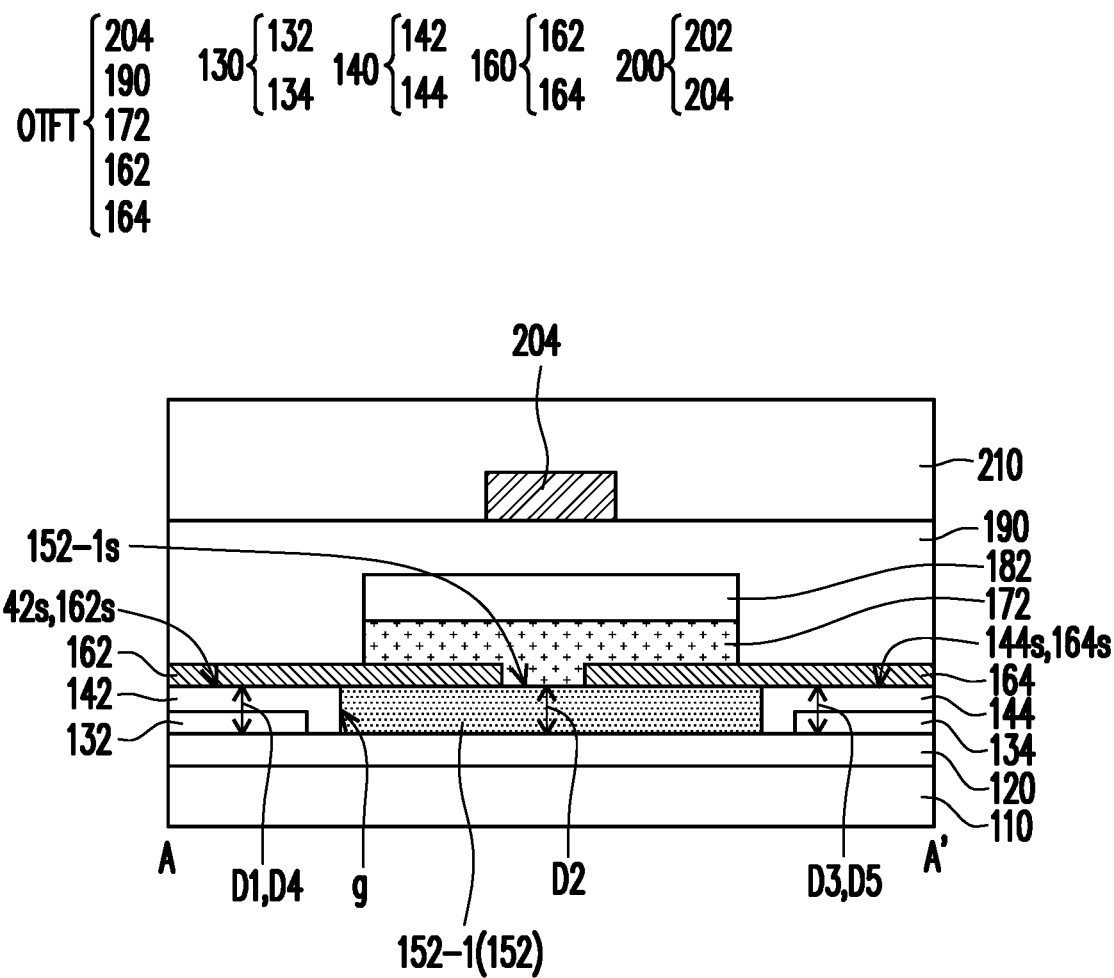

Referring to FIG. 1J and FIG. 2J, next, an organic protection layer 210 is formed on the base 110 to cover the third conductive pattern layer 200. The organic protection layer 210 has a contact window 210a (as shown in FIG. 1J) overlapping the contact window 190a of the organic gate insulating layer 190. In the embodiment, the material of the organic protection layer 180 may include a polymer having a hydroxyl side chain to react with a carboxylic acid containing ethylene or diene, or a derivative thereof. For example, the organic protection layer 180 may include poly(2-hydroxyethyl methacrylate), poly(vinylphenol), poly(vinyl alcohol), and copolymers thereof, such as poly(vinyl alcohol-co-ethylene) or poly(vinylphenol/methyl methacrylate), but the disclosure is not limited thereto.

Referring to FIG. 1K, FIG. 2K, FIG. 3 and FIG. 4, next, the pixel electrode 220 is formed on the organic protection layer 210. The pixel electrode 220 is electrically connected to the second metal oxide pattern 144 through the contact window 210a of the organic protection layer 210 and the contact window 190a of the organic gate insulating layer 190, and the pixel electrode 220 is further electrically connected to the drain 164 of the organic thin film transistor OTFT. The pixel electrode 220 may overlap the third conductive pattern 136 to form a storage capacitor of the organic semiconductor substrate 10. At the stage, the organic semiconductor substrate 10 of the embodiment is completed.

It must be noted here that the following embodiments use the element numbers and part of the content of the foregoing embodiments, wherein the same numbers are used to represent the same or similar elements, and the description of the same technical content is omitted. For the description of the omitted parts, reference may be made to the foregoing embodiments, and the following embodiments will not be repeated.

Figure 5:
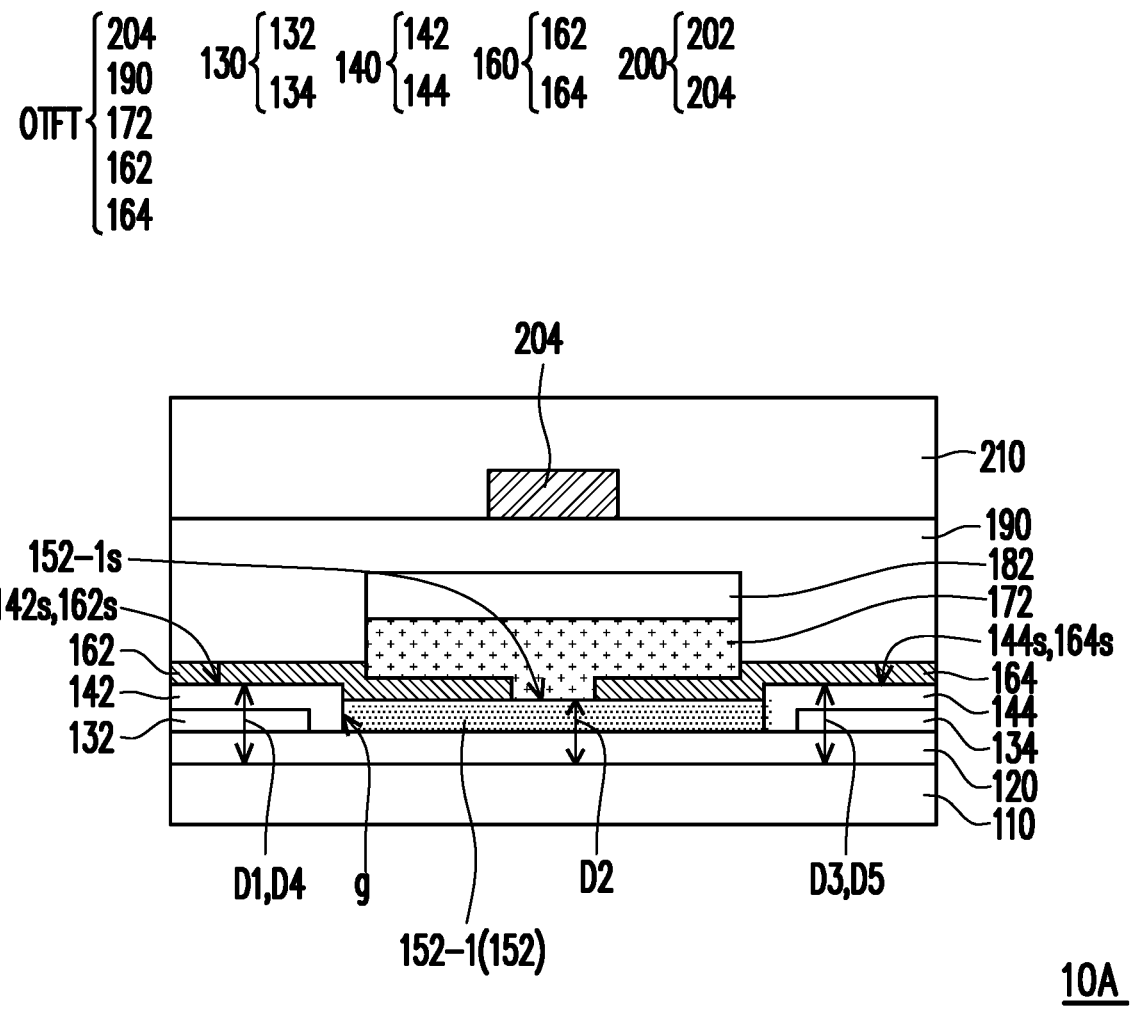
FIG. 5 is a schematic cross-sectional view of an organic semiconductor substrate 10A according to an embodiment of the disclosure.

FIG. 5 is a schematic cross-sectional view of an organic semiconductor substrate 10A according to an embodiment of the disclosure.

Figure 2K:
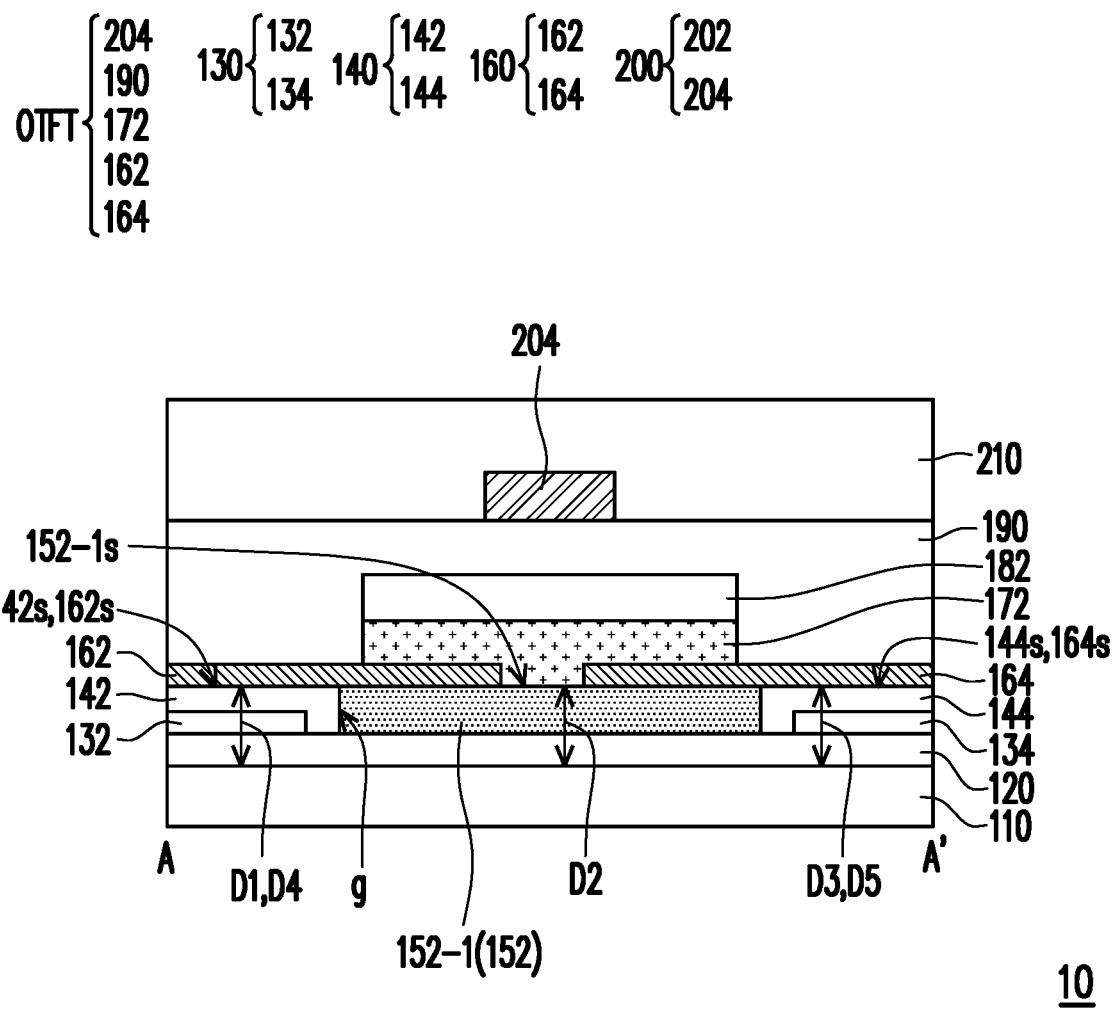

The organic semiconductor substrate 10A of FIG. 5 is similar to the organic semiconductor substrate 10 of FIG. 2K. The differences between the two are illustrated in the following paragraph. For the same points or similarities between the two, refer to the foregoing description, which is not iterated herein.

In the embodiment of FIG. 2K, the second distance D2 between the surface 152-1s of the first portion 152-1 of the organic flat pattern layer 152 and the base 110 is substantially equal to the first distance D1 between the surface 142s of the first metal oxide pattern 142 and the base 110. However, in the embodiment of FIG. 5, the second distance D2 between the surface 152-1s of the first portion 152-1 of the organic flat pattern layer 152 and the base 110 is less than the first distance D1 between the surface 142s of the first metal oxide pattern 142 and the base 110.

What is claimed is:

1. An organic semiconductor substrate, comprising:
a base;
a first conductive pattern and a second conductive pattern disposed on the base and separated from each other;
a first metal oxide pattern and a second metal oxide pattern respectively covering the first conductive pattern and the second conductive pattern and respectively electrically connected to the first conductive pattern and the second conductive pattern;
an organic flat pattern layer comprising a first portion, wherein the first portion of the organic flat pattern layer is disposed between the first metal oxide pattern and the second metal oxide pattern, the first metal oxide pattern comprises a surface facing away from the base, the surface of the first metal oxide pattern comprises a first distance from the base, the first portion of the organic flat pattern layer comprises a surface facing away from the base, the surface of the first portion of the organic flat pattern layer comprises a second distance from the base, and the second distance is less than or equal to the first distance;
a source and a drain separated from each other, wherein the source and the drain respectively are disposed on the first metal oxide pattern and the second metal oxide pattern and are electrically connected to the first metal oxide pattern and the second metal oxide pattern, respectively;
an organic semiconductor pattern disposed on the source, the drain, and the first portion of the organic flat patterned layer, wherein two regions of the organic semiconductor pattern respectively are electrically connected to the source and the drain;
an organic gate insulating layer disposed on the organic semiconductor pattern; and
a gate disposed on the organic gate insulating layer;
wherein the organic flat pattern layer comprises a first opening and a second opening; in a top view of the organic semiconductor substrate, the first metal oxide pattern fills up and does not exceed the first opening of the organic flat pattern layer, and the second metal oxide pattern fills up and does not exceed the second opening of the organic flat pattern layer.

2. The organic semiconductor substrate of claim 1, wherein the second metal oxide pattern comprises a surface facing away from the base, the surface of the second metal oxide pattern comprises a third distance from the base, and the second distance is less than or equal to the third distance.

3. The organic semiconductor substrate of claim 1, wherein the first conductive pattern comprises a data line, and vertical projection of the first conductive pattern on the base is within vertical projection of the first metal oxide pattern on the base.

4. The organic semiconductor substrate of claim 1, wherein the first conductive pattern comprises a data line, the data line comprises a line width in a first direction, the data line comprises a length in a second direction intersecting with the first direction, the first metal oxide pattern comprises a width in the first direction, the first metal oxide pattern comprises a length in the second direction, the width of the first metal oxide pattern is greater than the line width of the data line, and the length of the first metal oxide pattern is greater than the length of the data line.

5. The organic semiconductor substrate of claim 1, further comprising:
a third conductive pattern disposed on the base and separated from the first conductive pattern and the second conductive pattern;
a third metal oxide pattern separated from the first metal oxide pattern and the second metal oxide pattern, wherein the third metal oxide pattern is electrically connected to and covers the third conductive pattern; and
a pixel electrode electrically connected to the drain and overlapping the third conductive pattern, wherein vertical projection of the third conductive pattern on the base is within vertical projection of the third metal oxide pattern on the base.

6. The organic semiconductor substrate of claim 1, further comprising:
a third conductive pattern disposed on the base and separated from the first conductive pattern and the second conductive pattern;

a third metal oxide pattern separated from the first metal oxide pattern and the second metal oxide pattern, wherein the third metal oxide pattern is electrically connected to and covers the third conductive pattern; and a pixel electrode electrically connected to the drain and overlapping the third conductive pattern, wherein a width of the third metal oxide pattern in a first direction is greater than a width of the third conductive pattern in the first direction, a width of the third metal oxide pattern in a second direction is greater than a width of the third conductive pattern in the second direction, and the first direction is intersected with the second direction.

7. The organic semiconductor substrate of claim 1, wherein the source comprises a contact surface in direct contact with the first metal oxide pattern, the contact surface of the source comprises a fourth distance from the base, and the fourth distance is greater than or equal to the second distance.

8. The organic semiconductor substrate of claim 7, wherein the drain comprises a contact surface in direct contact with the second metal oxide pattern, the contact surface of the drain comprises a fifth distance from the base, and the fifth distance is greater than or equal to the second distance.

9. The organic semiconductor substrate of claim 1, wherein the first metal oxide pattern and the second metal oxide pattern belong to a metal oxide pattern layer, and the metal oxide pattern layer is complementary to the organic flat pattern layer.

\* \* \* \* \*